US011093831B1

(12) United States Patent
Ashdown et al.

(10) Patent No.: US 11,093,831 B1
(45) Date of Patent: Aug. 17, 2021

(54) SYSTEM AND METHOD FOR NEURAL NETWORK RADIOSITY CALCULATIONS

(71) Applicant: SUNTRACKER TECHNOLOGIES LTD., Victoria (CA)

(72) Inventors: Ian Edward Ashdown, West Vancouver (CA); Oleksandr Ponomarov, North Vancouver (CA)

(*) Notice: Subject to any disclaimer, the term of this patent is extended or adjusted under 35 U.S.C. 154(b) by 0 days.

(21) Appl. No.: 17/169,849

(22) Filed: Feb. 8, 2021

Related U.S. Application Data

(60) Provisional application No. 62/971,971, filed on Feb. 8, 2020.

(51) Int. Cl.
G06N 3/08 (2006.01)
G06N 3/04 (2006.01)
G06F 30/13 (2020.01)

(52) U.S. Cl.
CPC ............. *G06N 3/08* (2013.01); *G06N 3/0427* (2013.01); *G06F 30/13* (2020.01)

(58) Field of Classification Search
CPC ......... G06N 3/0427; G06N 3/08; G06F 30/13
See application file for complete search history.

(56) References Cited

PUBLICATIONS

Ashdown, Ian, Radiosity: A Programmer's Perspective, 515 pages, John Wiley & Sons, 2002. (Year: 2002).*
Ashdown, I. 1994. Radiosity: A Programmer's Perspective, pp. 284-285. New York, NY:John Wiley & Sons.
Bohn, C.-A., 2003. "A Neural Network-Based Finite Element Grid Generation Algorithm for the Simulation of Light Propagation," Applied Numerical Mathematics 46(3-4):263-277.
Constantin, J., et al. 2020. "Pooling Spike Neural Network for Fast Rendering in Global Illumination," Neural Computing and Applications 32:427-446.
Cuttle, C. 1997. "Cubic Illumination," Lighting Research & Technology 29(1):1-14.
Dahm, K., and A. Keller. 2017. "Learning Light Transport the Reinforced Way," ACM SIGGRAPH 2017 Talks Article 73.
Gers, F. A., et al. 1999. "Learning to Forget: Continual Prediction with LSTM," Technical Report IDSIA-01-99. Dalle Molle Institute for Artificial Intelligence, Lugano, Switzerland.
Gortler, S., and M. F. Cohen. 1993. Radiosity and Relaxation Methods: Progressive Radiosity is Southwell Iteration. Princeton University Technical Report CS-TR-408-93.

(Continued)

*Primary Examiner* — Kamran Afshar
*Assistant Examiner* — Marshall L Werner

(57) ABSTRACT

A system and method for a neural network that is trained to recognize patterns in the exitance convergence behaviour of a radiosity equation being solved for a set of finite element environments, and subsequently employed to monitor and predict the exitance convergence behaviour of novel finite element environments. The neural network is trained with feature vectors representing partial snapshots of exitance vectors at various iterations in a radiosity calculation. The feature vectors are related to numbers of iterations that can be skipped by making approximate calculations instead of performing the iterations. In use, when a radiosity equation is being solved, the neural network identifies feature vectors generated during the calculations that signify that a certain number of iterations can be skipped by making an approximate calculation.

16 Claims, 10 Drawing Sheets

(56) References Cited

PUBLICATIONS

Hermosilla, P., et al. 2019. "Deep Learning the Latent Space of Light Transport," Computer Graphics Forum 38(4):207-217.
Mandl, D., et al. 2017. "Learning Lightprobes for Mixed Reality Illumination," Proc. IEEE 2017 International Symposium on Mixed and Augmented Reality (ISMAR), pp. 82-89.
Müller, T., et al. 2019. "Neural Importance Sampling," ACM Transactions on Graphics 38(5) Article 145.
Shao, M. and N. I. Badler. 1993. "Analysis and Acceleration of Progressive Refinement Radiosity Method," Proc. Fourth Eurographics Workshop on Rendering.
Thomas, M. M., and A. G. Forbes. 2018. "Deep Illumination: Approximating Dynamic Global Illumination with Generative Adversarial Networks," arXiv:1710:09834v2.
Kasim. M. F. et al. 2020. "Up to two billion times acceleration of scientific simulations with deep neural architecture search", arXiv:2001.08055v1.

* cited by examiner

SYSTEM AND METHOD FOR NEURAL NETWORK RADIOSITY CALCULATIONS

TECHNICAL FIELD

The subject matter of the present invention relates to the simulation of light transport in virtual environments. In particular, it discloses the use of a recurrent neural network in combination with Southwell iteration to solve the radiosity equation for a virtual environment represented by an ensemble of finite elements.

BACKGROUND

As described in Ashdown, I. 1994. Radiosity: A Programmer's Perspective. New York, N.Y.: John Wiley & Sons, Southwell iteration can be used to solve the radiosity equation for a virtual environment represented by an ensemble of finite elements. The radiosity equation can be expressed in matrix form (p. 384) as:

$$\begin{bmatrix} M_{01} \\ \vdots \\ M_{0n} \end{bmatrix} = \begin{bmatrix} 1-\rho_1 F_{11} & \cdots & -\rho_1 F_{1n} \\ \vdots & \ddots & \vdots \\ -\rho_n F_{n1} & \cdots & 1-\rho_n F_{nn} \end{bmatrix} \begin{bmatrix} M_1 \\ \vdots \\ M_n \end{bmatrix} \quad (1)$$

where n is the number of finite elements in the environment, $M_{oi}$ is the initial exitance of element i, $\rho_i$ is its reflectance, $F_{ij}$ is the form factor between element i and element j, and $M_i$ is the final exitance of element i after all of the light has been transported by means of diffuse reflection between the elements. In matrix notation, this can be succinctly expressed as (p. 385):

$$M_o = (I-RF)M \quad (2)$$

where I is the identity matrix, M is the final n×1 exitance vector, $M_o$ is the initial n×1 exitance vector, R is a diagonal n×n matrix whose $(i,i)^{th}$ element is $\rho_i$, and F is the n×n form factor matrix.

Equation 1 is a Fredholm equation of the second kind that can be solved iteratively using Jacobi or Gauss-Seidel iteration. Unfortunately, these techniques require that all form factors Fj be precalculated and stored in memory (i.e. primary memory), which is impractical for environments with hundreds of thousands to millions of elements. An alternative technique called "progressive radiosity," which is a variant of Southwell iteration (e.g., Gortler, S., and M. F. Cohen. 1993. Radiosity and Relaxation Methods: Progressive Radiosity is Southwell Iteration. Princeton University Technical Report CS-TR-408-93), requires only one column of F to be computed "on the fly" and stored in memory for each iteration.

As noted by Ashdown (p. 390), the Jacobi iterative method may be expressed as:

$$M^{(k)} = M_o + RFM^{(k-1)} \quad (3)$$

for each iteration k, where $M^{(0)}$ is simply an initial guess as to what M will be once the iterative method converges. If $M^{(0)}$ is chosen to be $M_o$, each iteration is equivalent to light being diffusely reflected from an element i to all other elements j in the environment for which the form factor $F_{ij}$ is greater than zero. (That is, element j is fully or partially visible to element i.) Thus, Jacobi iteration with $M^{(0)} = M_o$ can be seen in terms of light "bouncing" from element to element in the environment until it is completely absorbed.

A residual vector Q is defined as:

$$Q = (I-RF)M - M_o \quad (4)$$

where the iteration is considered to have converged when the Euclidean norm (that is, the n-dimensional length) of the vector Q is less than some predetermined fraction of the Euclidean norm of $M_o$.

The Gauss-Seidel iterative method (Ashdown, pp. 390-391) is one of several methods that are used to improve the convergence of a square system of linear equations with positive definite matrices (which includes the radiosity equation). In terms of the radiosity equation, the method tries to anticipate the light each element will receive from the next iteration. While there is no physical analogue to this process, the Gauss-Seidel and similar methods usually converge more quickly than the Jacobi method does. Shao, M. and N. I. Badler. 1993. "Analysis and Acceleration of Progressive Refinement Radiosity Method," Proc. Fourth Eurographics Workshop on Rendering, for example, demonstrated a successive overrelaxation method they called "positive overshooting" that accelerated convergence compared to the Jacobi method by a factor of two or more (Ashdown, p. 400).

What these methods have in common is that they attempt to predict the amount of light that will be transferred between elements in the next iteration (k+1) and refine the estimated exitance vector $M^{(k)}$ accordingly. Without any knowledge of what the system of linear equations represents, they are incapable of "looking ahead" and predicting what will happen with subsequent iterations (k+m) for m>1.

SUMMARY

The inventors have found a way of predicting what will happen after subsequent iterations (k+m) for m>1 during the convergence of a radiosity equation. It is possible that the convergence of Equation 3 can be improved beyond that attainable with existing successive overrelaxation methods.

Using the predictions in the method disclosed herein may reduce the time taken to solve a radiosity equation and reduce the burden placed on computing hardware. Radiosity solutions for environments such as interior building environments allow architects to see the effect of adjusting the placement of luminaires, the locations of windows, the positions of doorways etc. in order to improve the building design, and they are more useful if they can be provided more rapidly. For example, an architect may, after viewing a rendering of a radiosity solution on a display device, adjust the position of a luminaire in the environment.

Disclosed herein is a method for providing training data to a neural network that predicts when iterations can be skipped in a radiosity equation that is being solved, the method comprising the steps of: saving an exitance vector for an iteration r of multiple iterations k of a radiosity calculation for an environment defined by multiple elements; selecting, at iteration r of the multiple iterations k, a subset of the elements that are visible to a sending element selected from the multiple elements; selecting a property of the subset of elements; generating a feature vector comprising, for each element of the subset of elements, a value of the property and an exitance; calculating, after p iterations after iteration r of the radiosity calculation, an approximate exitance vector $\tilde{M}^{(r+p)}$ using the saved exitance vector, two other saved exitance vectors and a curve-fitting calculation; determining that $|\tilde{M}^{(r+p)} - M^{(k)}|$ is below a limit, wherein $M^{(k)}$ is a current exitance vector at iteration k=r+p of the radiosity calculation; and presenting the feature vector to the neural network for training the neural network. The method may further comprising, between the calculating and determining steps: establishing that $|\tilde{M}^{(r+p)}-M^{(k)}|$ is below the limit; performing one or more further iterations of the radiosity calculation; and calculating, with an increased value of p, another approximate exitance vector $\tilde{M}^{(r+p)}$ which is used in the determining step.

Also disclosed is a method for skipping iterations when solving a radiosity equation, the method comprising the steps of: selecting, at an iteration k of a radiosity calculation for an environment defined by multiple elements, a subset of the elements that are visible to a sending element selected from the multiple elements; selecting a property of the subset of elements; generating a feature vector comprising, for each element of the subset of elements, a value of the property and an exitance calculated at iteration k of the radiosity calculation; submitting the feature vector to a neural network that comprises a model relating feature vectors to numbers of iterations that can be skipped in radiosity calculations; receiving, from the neural network, a number of iterations q that can be skipped; and calculating an approximate exitance vector for iteration (k+q) of the radiosity calculation. In some embodiments, the calculating step comprises curve-fitting to a current exitance vector and one or more prior exitance vectors and extrapolating to iteration (k+q) to obtain the approximate exitance vector.

Further disclosed is a system for training a neural network that predicts when iterations can be skipped in a radiosity equation that is being solved comprising one or more processors and one or more computer readable memories storing computer readable instructions, which, when executed by the one or more processors, cause the system to: save an exitance vector at an iteration r of multiple iterations k of a radiosity calculation for an environment defined by multiple elements; select, at iteration r of the multiple iterations k, a subset of the elements that are visible to a sending element selected from the multiple elements; select a property of the subset of elements; generate a feature vector comprising, for each element of the subset of elements, a value of the property and an exitance; calculate, after p iterations after iteration r of the radiosity calculation, an approximate exitance vector $\tilde{M}^{(r+p)}$ using the saved exitance vector, two other saved exitance vectors and a curve-fitting calculation; determine that $|\tilde{M}^{(r+p)}-M^{(k)}|$ is below a limit, wherein $M^{(k)}$ is a current exitance vector at iteration k=r+p of the radiosity calculation; and present the feature vector to the neural network for training the neural network. In some embodiments, the one or more processors and the one or more computer readable memories are distributed amongst: a first computer configured to perform the radiosity calculation; a second computer configured to support the neural network; a first database connected to the first and second computers and configured to store the feature vector; a second database connected to the first and second computers and configured to store the approximate exitance vector $\tilde{M}^{(r+p)}$; and a third database connected to the first and second computers and configured to store all the saved exitance vectors.

Still further disclosed is a system for skipping iterations when solving a radiosity equation comprising one or more processors and one or more computer readable memories storing computer readable instructions, which, when executed by the one or more processors, cause the system to: select, at an iteration k of a radiosity calculation for an environment defined by multiple elements, a subset of the elements that are visible to a sending element selected from the multiple elements; select a property of the subset of elements; generate a feature vector comprising, for each element of the subset of elements, a value of the property and an exitance calculated at iteration k of the radiosity calculation; submit the feature vector to a neural network that comprises a model relating feature vectors to numbers of iterations that can be skipped in radiosity calculations; receive, from the neural network, a number of iterations q that can be skipped; and calculate an approximate exitance vector for iteration (k+q) of the radiosity calculation.

DETAILED DESCRIPTION

Figure 1:
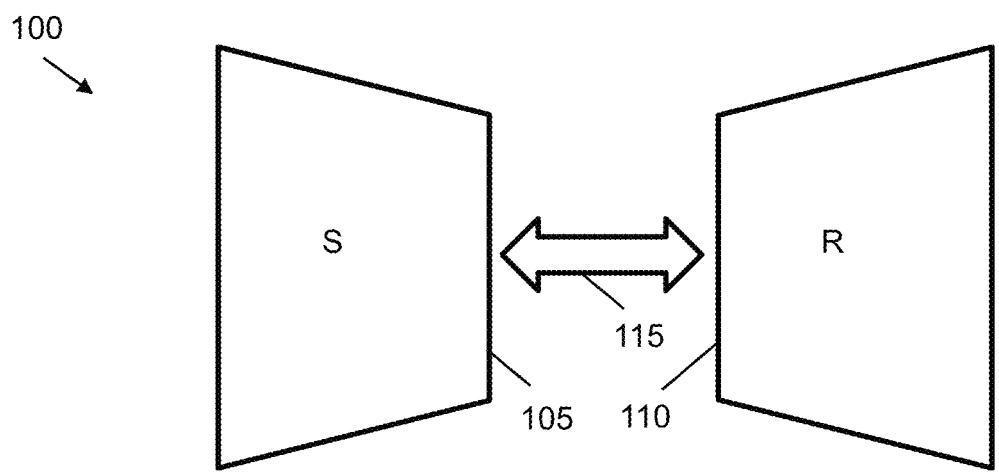
FIG. 1 shows a minimal environment comprised of two finite-area elements.

In FIG. 1, a minimal environment 100 consisting of two finite-area elements 105 (labelled S) and 110 (labelled R) is shown. Element 105 has area $A_S$, reflectance $\rho_S$ and initial exitance $M_{oS}$, while element 110 has area $A_R$, reflectance $\rho_R$ and zero exitance. According to the reciprocity relation (Ashdown, p. 51), the form factors are related by the equation $A_S F_{SR}=A_R F_{RS}$. Also, $F_{SS}=F_{RR}=0$ for planar elements. (In other words, a planar element is not visible to itself.)

Referring to Equation 3, the first iteration (k=1) is given by:

$$\begin{bmatrix} M_s \\ M_R \end{bmatrix} = \begin{bmatrix} M_{oS} \\ 0 \end{bmatrix} + \begin{bmatrix} \rho_S & 0 \\ 0 & \rho_R \end{bmatrix} \begin{bmatrix} 0 & F_{SR} \\ F_{RS} & 0 \end{bmatrix} \begin{bmatrix} M_{oS} \\ 0 \end{bmatrix} \quad (5)$$

which is physically equivalent to light 115 being diffusely emitted by sending element 105 and a portion $F_{SR}$ being received by receiver element 110.

If we expand iterative Equation 3 into a single equation, we have the MacLaurin power series expansion (Ashdown, p. 387):

$$M = M_o + RFM_o + (RF)^2 M_o + (RF)^3 M_o + \ldots \quad (6)$$

which is physically equivalent to the diffusely reflected light 115 being iteratively "bounced" between elements 105 and 110 until it has been completely absorbed and Equation 6 has converged to the final exitance vector M. (That is, the Euclidean norm of the residual vector Q is less than a few percent of the Euclidean norm of the initial exitance vector $M_o$.)

The exitance of each element in the minimal environment 100 increases with every second iteration. Thus:

$$M_S = M_{oS} + (RF)^2 M_o + (RF)^4 M_o + (RF)^6 M_o + \ldots \quad (7)$$

and:

$$M_R = 0 + RFM_o + (RF)^3 M_o + (RF)^5 M_o + \ldots \quad (8)$$

Figure 2:
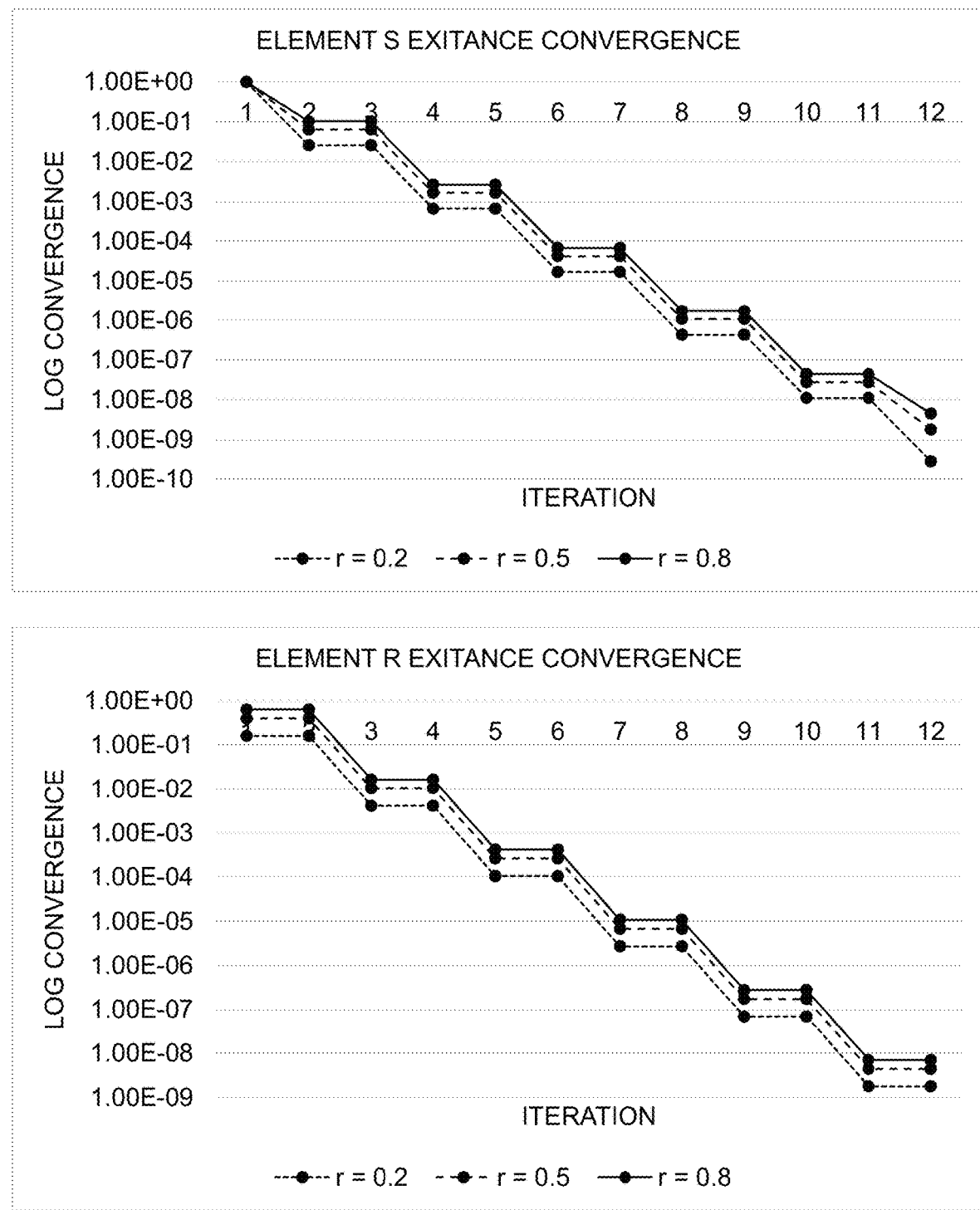
FIG. 2 shows the convergence of the exitance estimates to the final exitances of two elements with the same reflectance values.

As an example, assume $A_S = A_R$, $\rho_S = \rho_R$ and $F_{SR} = F_{RS} = 0.8$. The convergence values of $M_S^{(k)} - M_S^{(k-1)}$ and $M_R^{(k)} - M_R^{(k-1)}$ for k=1, ..., 12 for reflectances of $\rho$=0.2, 0.5 and 0.8 are plotted logarithmically in FIG. 2. (These values represent the increase in element exitance M for each iteration.) As may be expected, these values decrease quickly and exponentially for each successive iteration.

Figure 3:
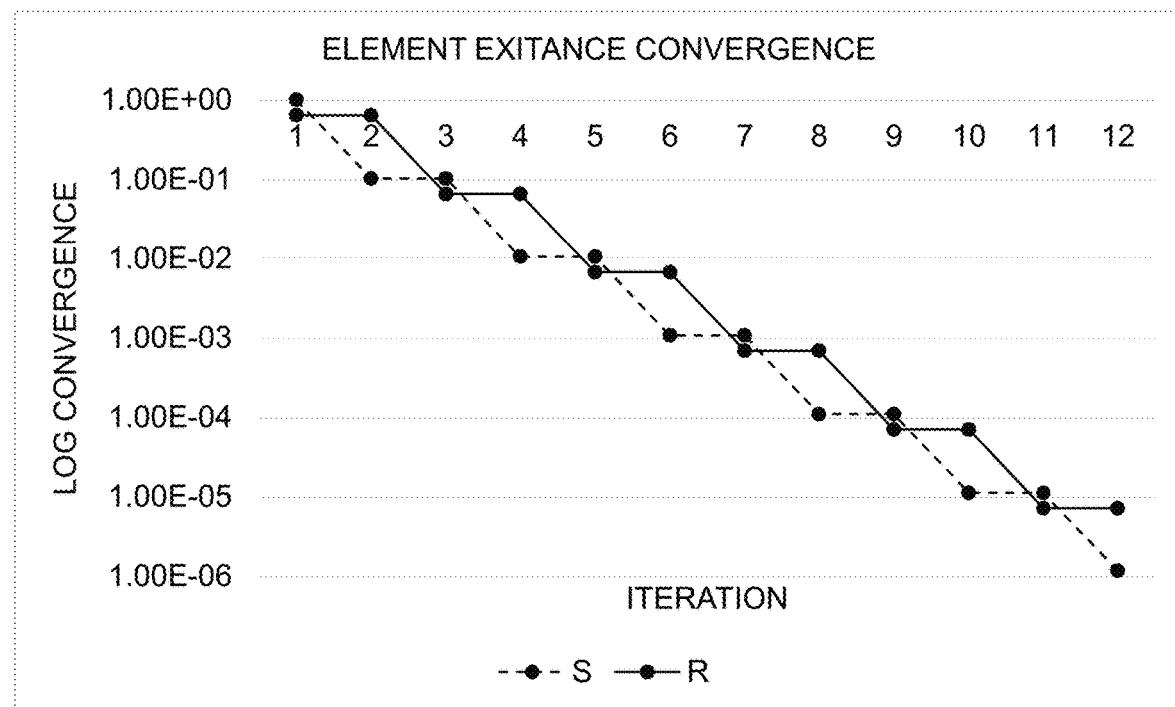
FIG. 3 shows the convergence of the exitance estimates to the final exitances of two elements with different reflectance values.

As another example, assume $A_S = A_R$, $\rho_S$=0.2, $\rho_R$=0.8 and $F_{SR} = F_{RS}$=0.8. The convergence values of $M_S^{(k)} - M_S^{(k-1)}$ and $M_R^{(k)} - M_R^{(k-1)}$ for k=1, ..., 12 are plotted logarithmically in FIG. 3. Again, the values decrease quickly and exponentially for each successive iteration, although at different initial values for the two elements due to their different reflectance values.

For each iteration k, the element j that received light from the sending element i has an excess of exitance $M_j^{(k)} - M_j^{(k-1)}$ that is eliminated at the next iteration when it "shoots" its exitance into the environment. For larger environments (i.e., n>2), the progressive radiosity method selects the element with the greatest "unshot" exitance to be the next sending element. This ensures that the radiosity solution converges as quickly as possible (Ashdown, pp. 384-386).

Figure 4:
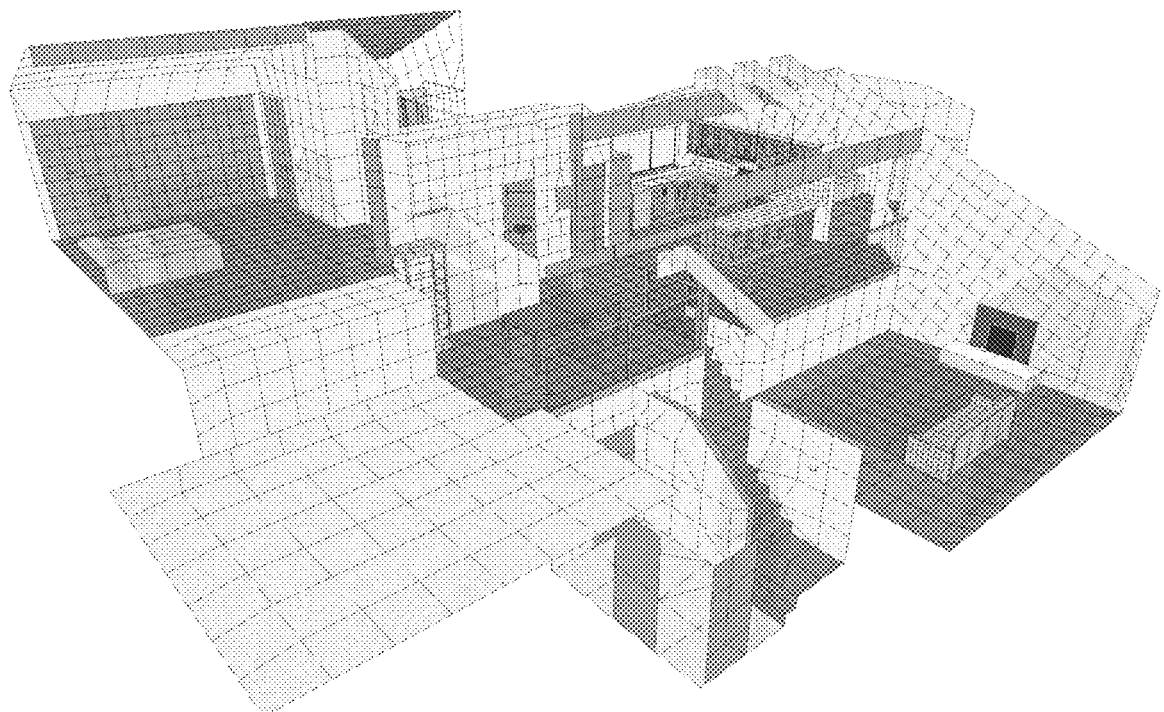
FIG. 4 shows the finite-element representation of a complex architectural environment.

In practice, the environments for which the progressive radiosity method is used often represent architectural or industrial spaces with tens of thousands to millions of elements. FIG. 4, for example, illustrates an architectural model of a residence with approximately 22,000 elements. In general, each element will receive light from tens to hundreds of other elements visible to it, and so its exitance will increase incrementally as it receives exitance shot from these other elements individually with each iteration. Typically, an environment will require hundreds to tens of thousands of iterations of the radiosity equation to achieve convergence where (for example) 99 percent of the initial exitance $M_o$ has been absorbed by the elements.

Figure 5:
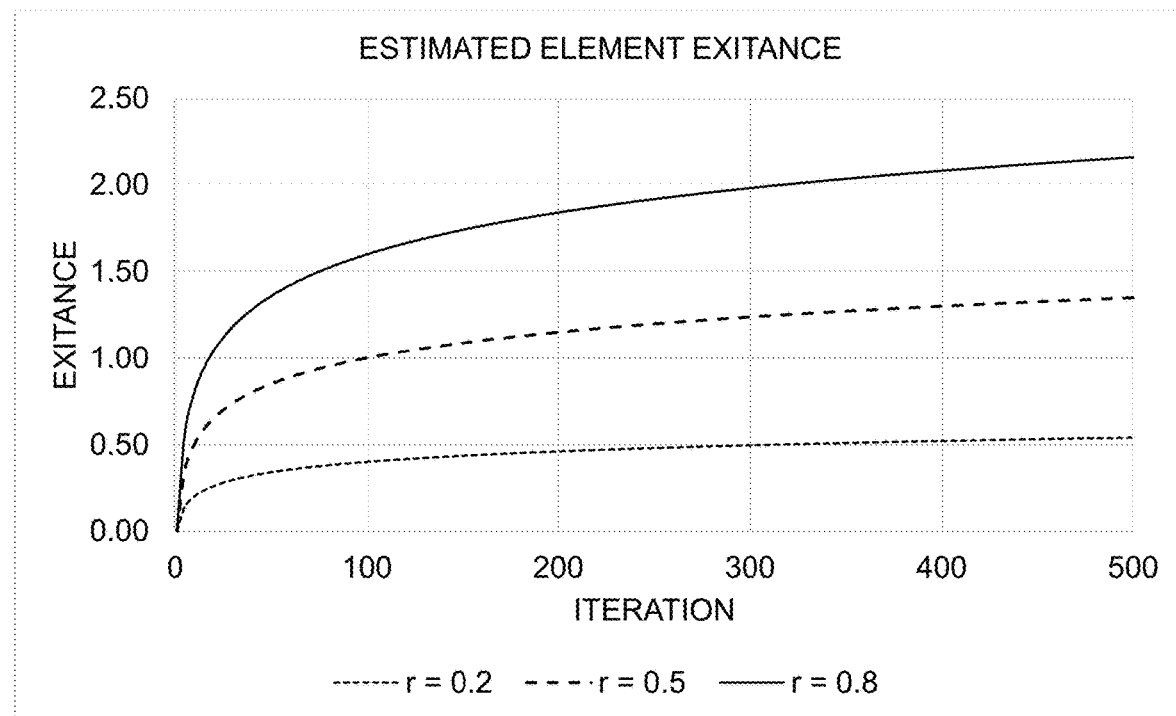
FIG. 5 shows the estimated element exitance convergence of three elements with different reflectance values.

For each element i, its estimated exitance $M_i^{(k)}$ will change abruptly for the first few iterations k as the element with the greatest unshot exitance is selected for each iteration. Once this has occurred, $M_i^{(k)}$ will tend to increase smoothly and logarithmically with increasing k. In FIG. 5, for example, three adjacent elements with equal visibility to other elements in the environment will exhibit logarithmically increasing estimated exitance that is dependent only on their reflectance values.

Figure 6:
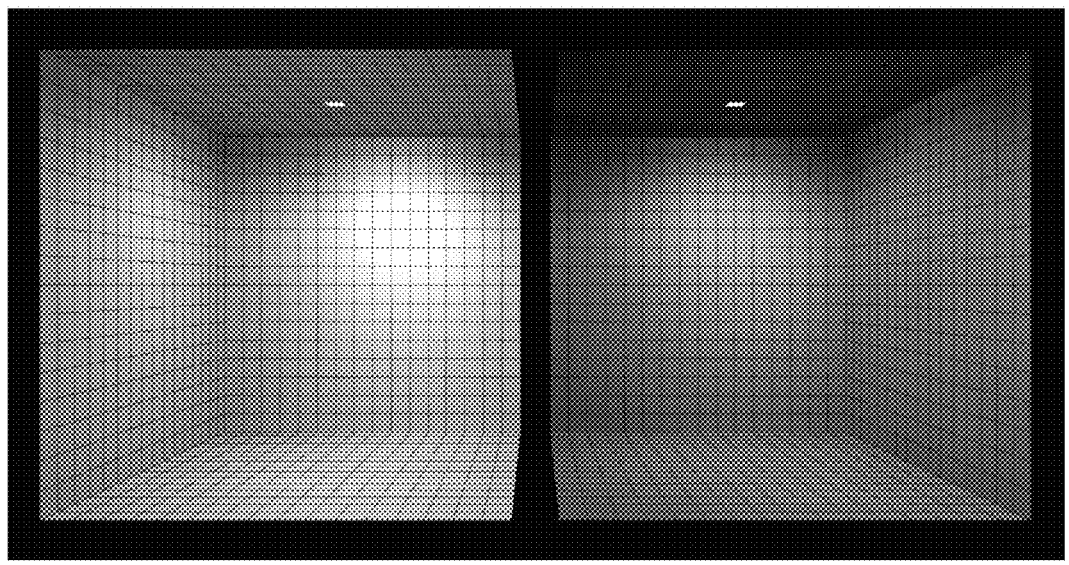
FIG. 6 shows the finite element representation of a relatively simple environment comprised of two empty enclosed spaces.
Figure 7:
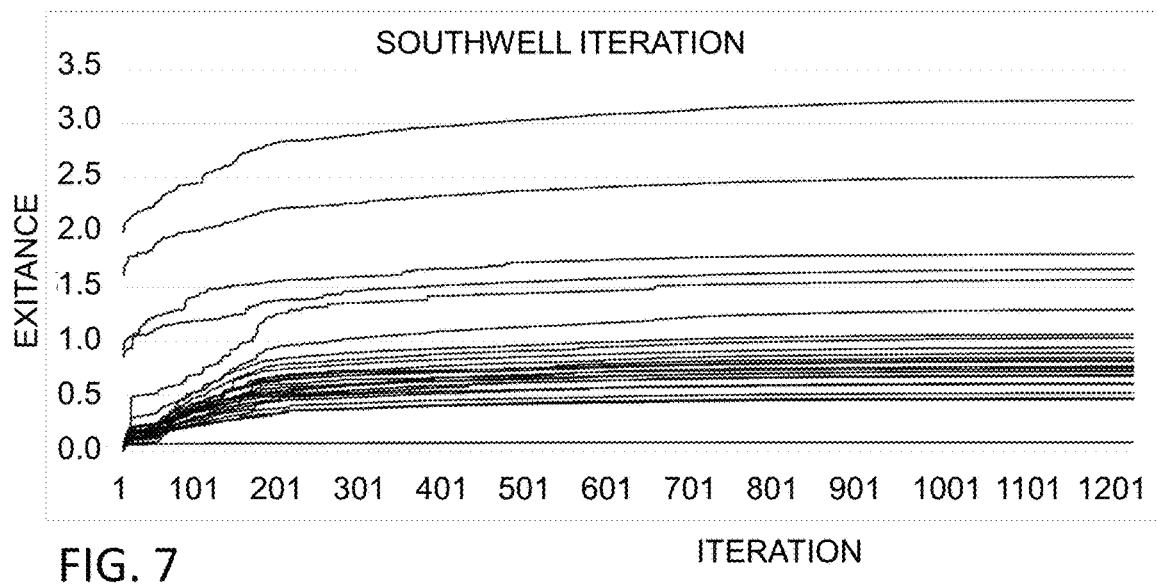
FIG. 7 shows the calculated element exitance convergence of 25 randomly-selected elements from the environment shown in FIG. 6.

FIG. 6 shows a relatively simple environment with 3,074 elements comprising two physically separate rectangular enclosures with a single light source in each enclosure. FIG. 7 shows the approximately logarithmic increase in estimated exitance for 25 randomly-selected elements from this environment over 1,250 iterations. There are a number of discontinuities of varying degrees for each element, but these decrease in magnitude with successive iterations until all elements exhibit only incremental changes in exitance.

In this example, it is evident that it is possible to predict the final exitance of any element after approximately 800 iterations using the initial exitance and current slope of the changes in exitance by fitting these values to a logarithmic curve—there is no need to compute further iterations. However, more complex environments, such as that shown in FIG. 4, will likely make it difficult to predict when exitance discontinuities between successive iterations are within predefined limits such that predicting the final element exitances will yield sufficiently accurate results.

Figure 8:
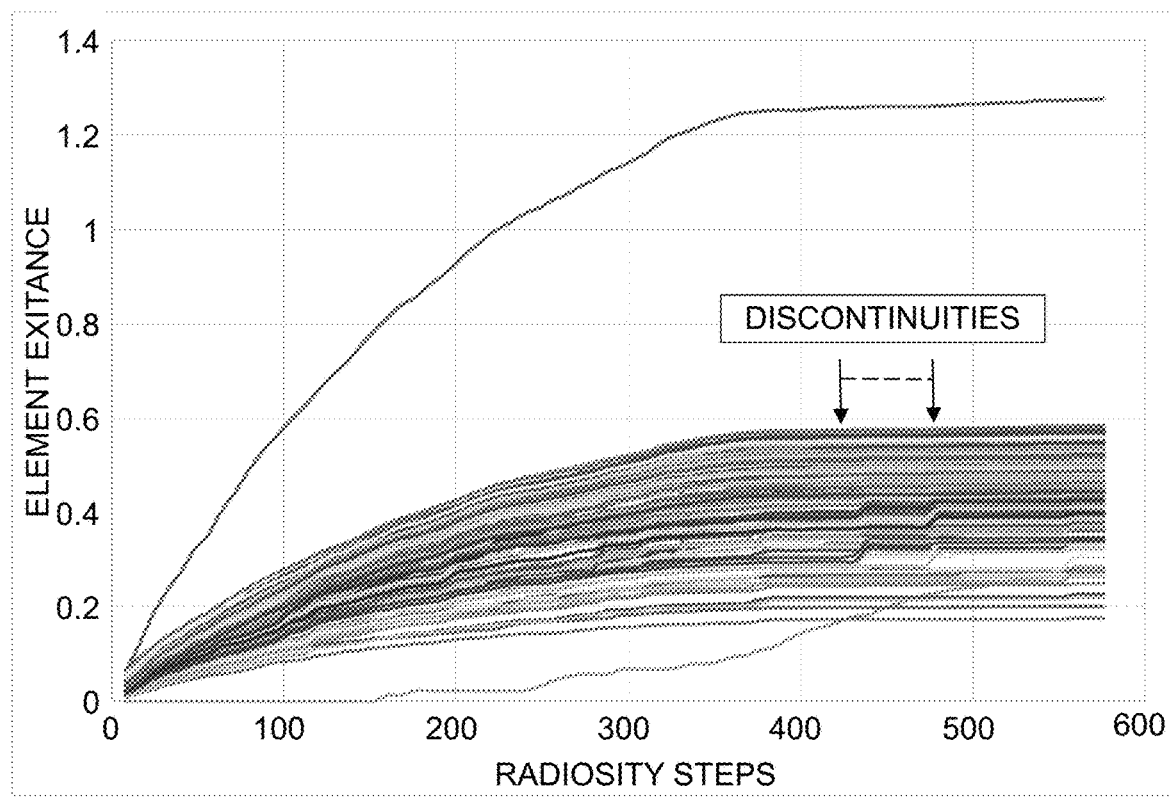
FIG. 8 shows the calculated element exitance convergence of 250 randomly-selected elements from the environment shown in FIG. 4.

As an example, FIG. 8 shows the approximately logarithmic increase in estimated exitance for 250 randomly-selected elements from this environment of approximately 22,000 elements over 580 iterations. The exitance discontinuities appear to be within reasonable limits at 400 iterations, but then exhibit marked increases at approximately 440 and 480 iterations shown by the arrows on the graph. The reason for this behaviour is that the architectural environment shown in FIG. 4 consists of a number of partially isolated rooms, each with their own light sources. The progressive radiosity method proceeds by selecting the element with the greatest unshot exitance at each iteration, so that elements in a given room may be effectively ignored over many iterations. The radiosity solution converges globally in a smoothly logarithmic manner, but local convergence (representing the interreflection of light between a group of elements visible to each other, such as in a room) may not proceed as smoothly.

Figure 9:
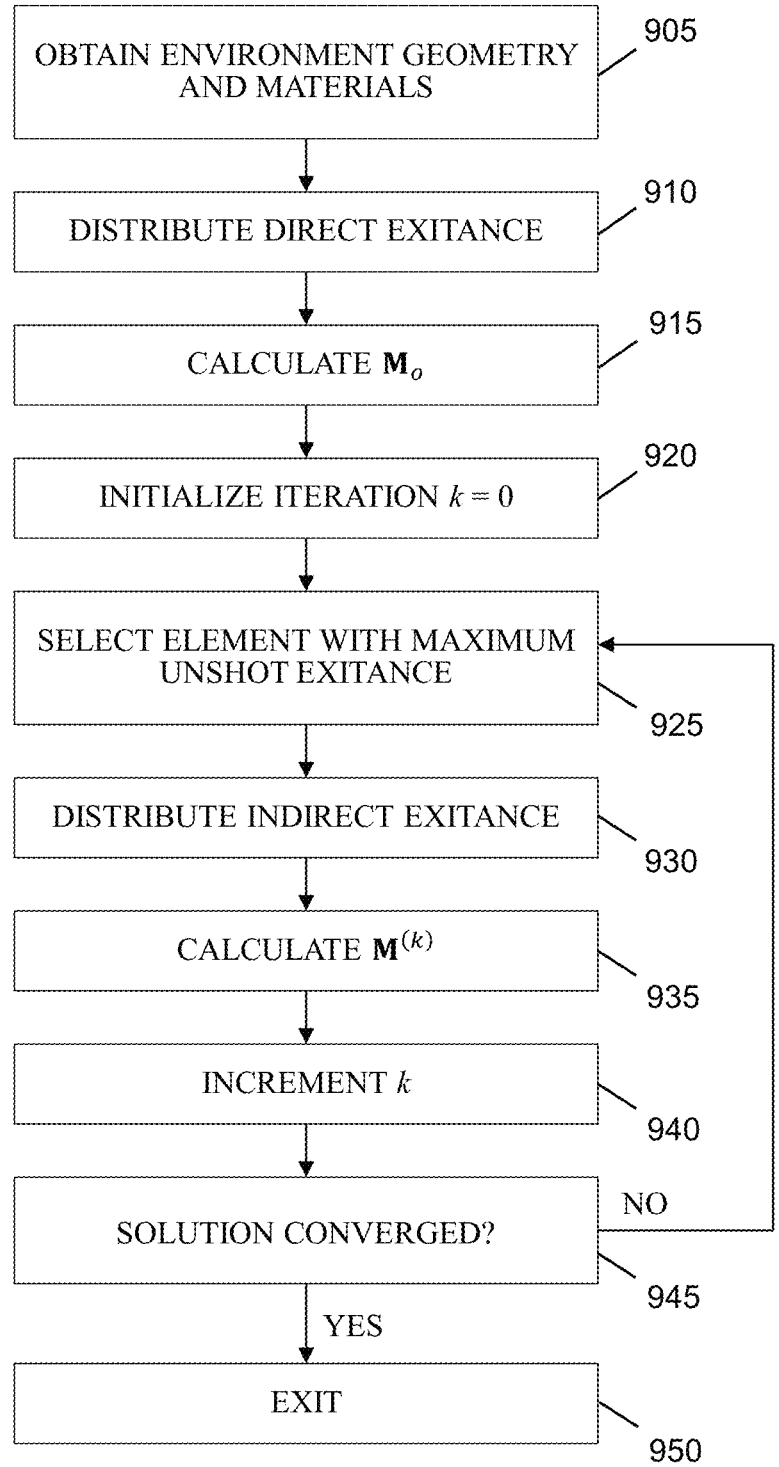
FIG. 9 shows a flow chart of the progressive radiosity method.

Referring to FIG. 9, the basic progressive radiosity method proceeds as follows. In Step 905, the environment geometry and materials are made accessible to the program. In Step 910, the light directly emitted by the luminaires in the environment (represented as luminous exitance M in accordance with Equation 1) is distributed ("shot") to all of the elements visible to the luminaires. In Step 915, the initial element exitances are expressed as the initial exitance vector $M_o$ in accordance with Equation 2.

In Step 920, the iteration counter k is initialized to zero.

In Step 925, the element with the maximum "unshot" exitance is selected. (The element exitance is the total amount of illuminance the element has received directly from the luminaires or reflected from other elements, divided by the element area; the "unshot" exitance is the element exitance multiplied by its reflectance $\rho$, and represents the light that will be diffusely reflected from the element in the current iteration.)

In Step 930, the indirect unshot exitance from the currently selected element is distributed to all of the elements visible to the element.

In Step 935, the current element exitances are expressed as the current exitance vector $M^{(k)}$ in accordance with Equation 3.

In Step 940, the iteration counter k is incremented.

In Step 945, the residual vector Q is calculated according to Equation 4. If the radiosity solution has converged, the method exits in Step 950; otherwise, the method returns to Step 925 for the next iteration.

What distinguishes the application of progressive radiosity to finite-element representations of physical environments from generic sets of linear equations solved by Southwell iteration is that there is a rich source of ancillary information available from the environment geometry and materials. The geometric representation of the environment typically consists of a set of elements wherein each element may be adjoined to one or more neighbouring elements (e.g., FIG. 4). With each iteration, the form factors $F_{ij}$ for the sending element i and all other elements j in the environment are calculated and available; these form factors represent the geometric visibility of each receiving element j to the sending element i. In addition, the reflectance ρ for every element in the environment is known at each iteration.

In principle, it should be possible to develop a set of heuristics from this information that can predict the estimated element exitance for multiple iterations at once. That is, given the changes in estimated element exitance $M^{(k)}$ over many iterations, it should be possible to predict $\tilde{M}^{(k+p)}$ as an estimate for $M^{(k+p)}$ for p>>1. For example, this may be done by fitting the exitance for each element to a logarithmic curve, or to any other suitable curve that represents the behaviour of the exitance as a function of iteration. It does not matter whether $M^{(k)}$ would converge to exactly $M^{(k+p)}$ after p further iterations because the predicted values of $\tilde{M}^{(k+p)}$ are simply an estimate of the final values of M. As long as the error $|\tilde{M}^{(k+p)}-M|$ is less than $|M^{(k+p)}-M|$, the radiosity solution will converge more quickly, thus requiring fewer iterations to obtain a solution with the desired accuracy.

Unfortunately, there is no known approach to manually developing such heuristics, mostly because of the arbitrary complexity of architectural and industrial environments.

Neural Networks

The radiosity method is one of a larger group of methods called "global illumination" techniques, wherein the distribution of light in a virtual environment is determined. Most of these techniques employ ray tracing to simulate the trajectories of photons, and from these estimate the approximate spectral radiance distribution across surfaces in the environment.

In Dahm, K., and A. Keller. 2017. "Learning Light Transport the Reinforced Way," ACM SIGGRAPH 2017 Talks Article 73, the authors disclose a method of training a neural network to recognize which photon paths through an environment as seen from a specific viewpoint are "important" to the images, and so bias the random selection of ray directions to minimize image noise.

In Müller, T., et al. 2019. "Neural Importance Sampling," ACM Transactions on Graphics 38(5) Article 145, the authors similarly train a neural network to bias the random selection of ray directions to minimize image noise for a specific viewpoint.

In Bohn, C.-A., 2003. "A Neural Network-Based Finite Element Grid Generation Algorithm for the Simulation of Light Propagation," Applied Numerical Mathematics 46(3-4):263-277, the author discloses a method of meshing three-dimensional surfaces into finite elements meshes using a neural network.

In Hermosilla, P., et al. 2019. "Deep Learning the Latent Space of Light Transport," Computer Graphics Forum 38(4):207-217, the authors use a point cloud representation of a three-dimensional object to train a convolutional neural network that can then generate physically realistic two-dimensional images of the object from any viewpoint.

In Thomas, M. M., and A. G. Forbes. 2018. "Deep Illumination: Approximating Dynamic Global Illumination with Generative Adversarial Networks," arXiv:1710:09834v2, the authors disclose a method of training a generative adversarial neural network using depth maps, diffuse maps, surface normal maps, and direct illumination for a specific viewpoint to generate novel configurations of the environment, including positions and orientations of the light and cameras, as well as new objects within the environment.

In Constantin, J., et al. 2020. "Pooling Spike Neural Network for Fast Rendering in Global Illumination," Neural Computing and Applications 32:427-446, the authors use thousands of images to train a pooling spike neural network to bias the random selection of ray directions in order to maximize human psycho-visual scores in rendered images.

None of these techniques however consider the concept of training a neural network to recognize trends in the exitance convergence behaviour of progressive radiosity on a per-element basis, with training data including the element geometry and materials information.

The exitance convergence behaviour illustrated in FIG. 5 may be understood as a temporal sequence of iterations for each element. Consequently, a recurrent neural network may be trained to learn an ensemble of sequences and predict their future values, although other types of neural networks may be employed. A particular example is the Long Short Term Memory (LSTM) neural network and its variants as described in for example Gers, F. A., et al. 1999. "Learning to Forget: Continual Prediction with LSTM," Technical Report IDSIA-01-99. Dalle Molle Institute for Artificial Intelligence, Lugano, Switzerland.

In an exemplary embodiment, the neural network samples the sequence of estimated exitances $M^{(k)}$ for a subset s of the elements. It further adaptively samples the sequence of iterations at p intervals, where p is chosen such that the convergence values $|M^{(k+p)}-M^{(k)}|$ are within a predefined threshold.

The neural network may further be trained with the element material spectral reflectance values represented as a triplet of RGB or CIE xyY color values rather than a single value.

The neural network may also be trained with geometric and material information related to each selected element, including but not limited to element properties such as:
Element area;
Distance between the element barycenter and those of any adjoining elements;
Form factors between the element and other visible and partially-visible elements;
Angles between element normal and those of other visible and partially-visible elements;
Estimated exitances of visible and partially-visible elements;
Spectral exitances of visible and partially-visible elements; and
Convergence values of visible and partially-visible elements.

As an example, the neural network may be trained with architectural models to recognize mostly rectangular rooms and, based on openings and doorways between them, the probable paths for the flow of light between them. From this, it can predict convergence of the radiosity solution of a local scale between groups of elements, and so predict when it is reasonable to extrapolate final exitances from the current iteration.

An advantage of this approach is that even if the neural network mispredicts the final exitances of individual elements, the iterative Southwell iteration will still converge to the final solution. All that matters is that on average, the element exitances predicted by the neural network result in fewer iterations.

Figure 10:
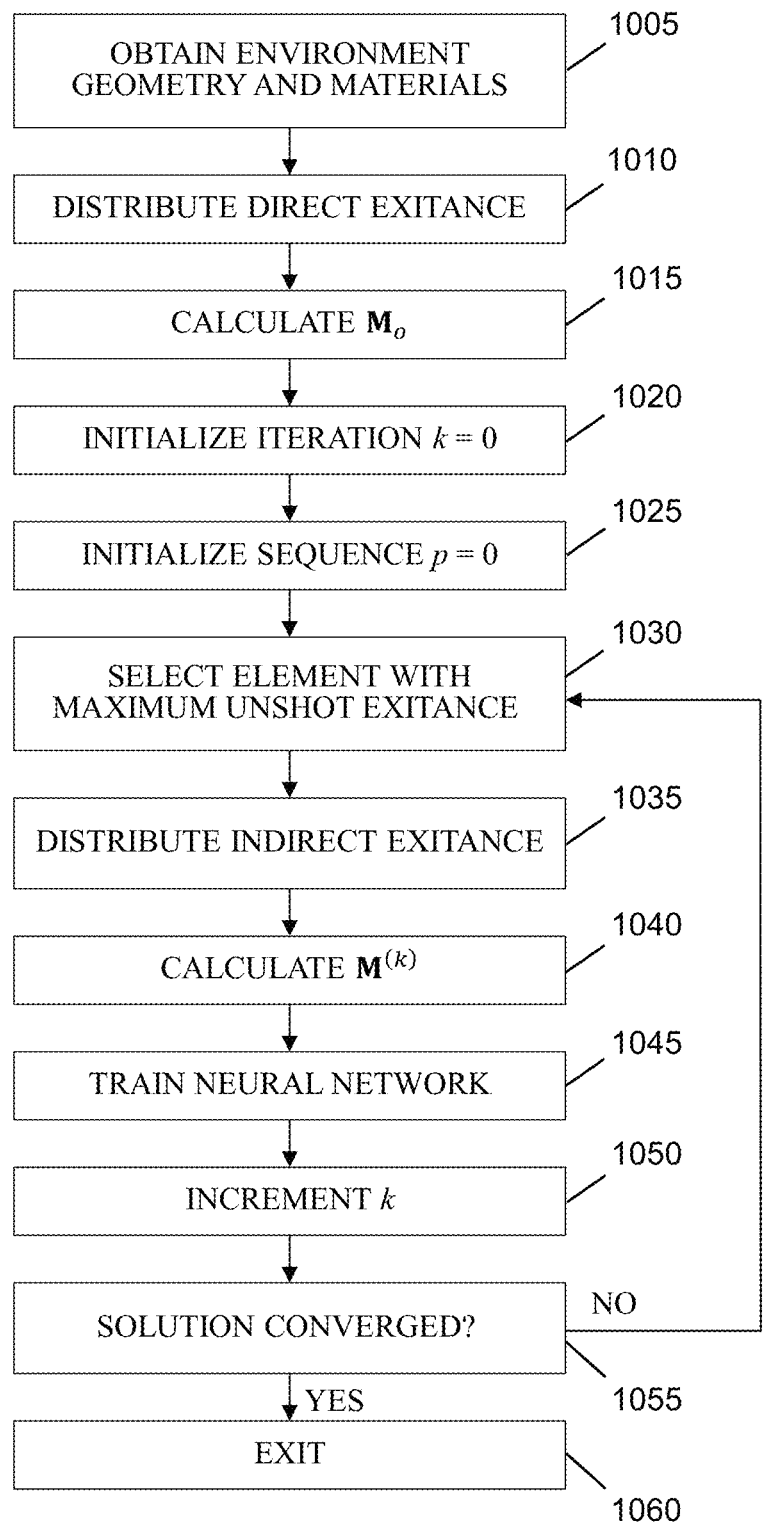
FIG. 10 shows a flow chart of the progressive radiosity method being used to train a neural network.

FIG. 10 shows a flowchart regarding how a neural network can be trained using the progressive radiosity method of FIG. 9. In Step 1005, the environment geometry and materials are made accessible to the program. In Step 1010, the exitance emitted by the luminaires in the environment is distributed to all of the elements visible to the luminaires. In Step 1015, the initial element exitances are expressed as the initial exitance vector $M_o$ in accordance with Equation 2.

In Step 1020, the iteration counter k is initialized to zero.
In Step 1025, the sequence counter p is initialized to zero.
In Step 1030, the element with the maximum "unshot" exitance is selected.

In Step 1035, the indirect unshot exitance is distributed to all of the elements visible to the currently selected element.

In Step 1040, the current element exitances are expressed as the current exitance vector $M^{(k)}$ in accordance with Equation 3.

Figure 11:
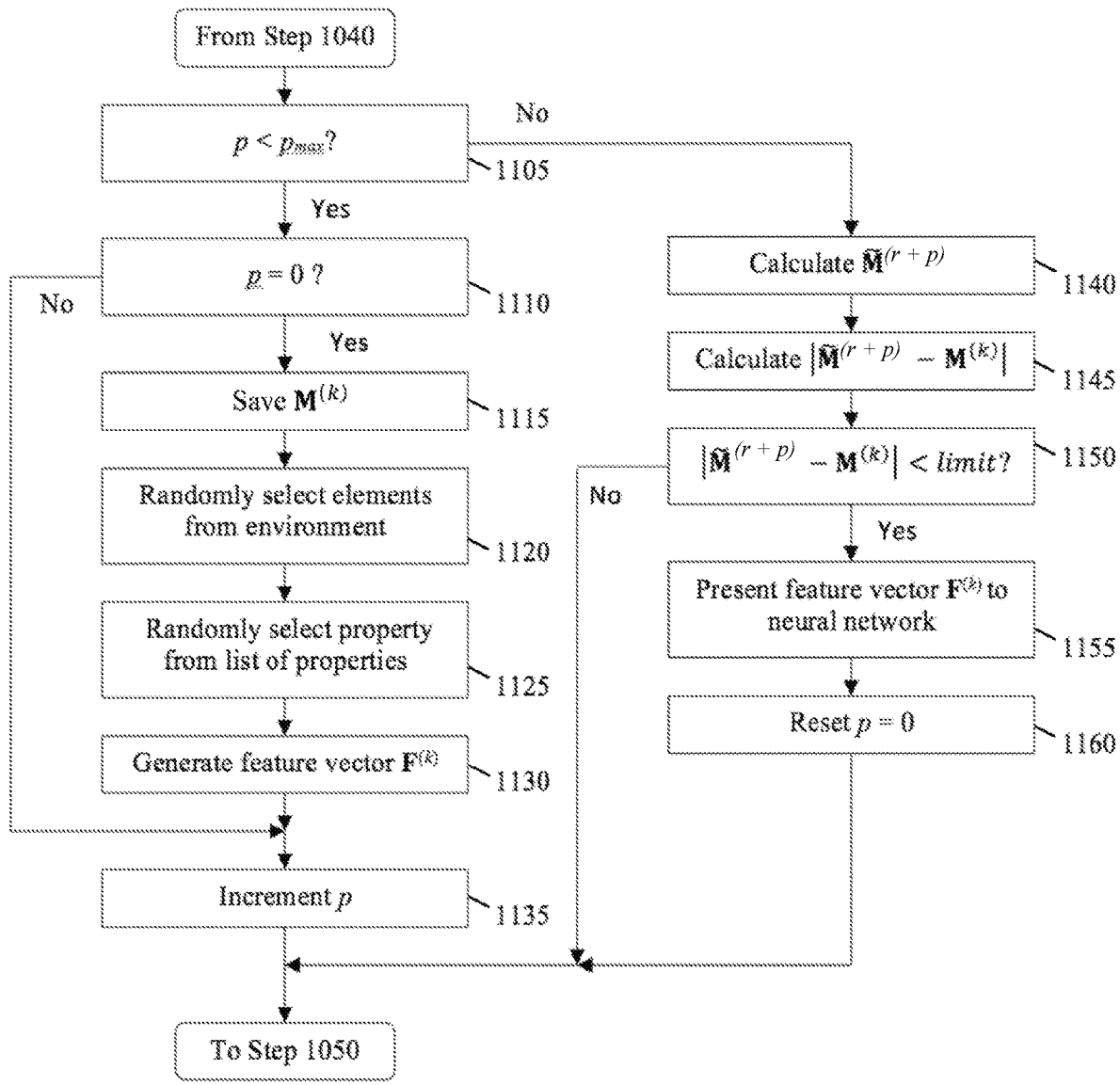
FIG. 11 shows a flow chart of a subroutine for training a neural network.

In Step 1045, the neural network is trained as will be disclosed in reference to FIG. 11.

In Step 1050, the iteration counter k is incremented.
In Step 1055, the residual vector Q is calculated according to Equation 4. If the radiosity solution has converged, the method exits in Step 1060; otherwise, the method returns to Step 1030 for the next iteration.

FIG. 11 shows a subroutine for training a neural network using the progressive radiosity method disclosed in FIG. 10 as Step 1045. In Step 1105, entered from Step 1040 of FIG. 10, the sequence counter p is queried. If its value is less than $p_{max}$, the subroutine continues to Step 1110; otherwise, the subroutine proceeds to Step 1140.

In Step 1110, the sequence counter p is again queried. If its value is zero, the subroutine continues to Step 1135; otherwise the subroutine proceeds to Step 1115.

In Step 1115, the current set of element exitances is saved as exitance vector $M^{(k)}$.

In Step 1120, a random subset 's' of elements is selected from the set of elements visible from the current element shooting its exitance. Depending on the number of visible elements, the subset may include anything from one to all of the visible elements, a predetermined percentage of the visible elements or a predetermined fixed number of elements. The optimal size of the random subset may vary for different classes of environments. It is possible that in other embodiments, the subset would be semi-random (e.g. one in each contiguous block of a fixed number of elements) or uniformly distributed.

In Step 1125, an element property, such as for example the element area, is randomly selected from the common list of element properties listed above. Other element properties not on this list may also be selected in other embodiments.

In Step 1130, a feature vector $F^{(k)}$, comprised of the current exitance and selected property value for each element of the element subset, is generated and saved for later use. A feature vector is a multi-dimensional vector of numerical features that represent an object. The same element property is used for all the elements in the subset. This feature vector may be considered to be a partial snapshot of the current state of convergence of the radiosity calculation.

In Step 1135, the sequence counter p is incremented, after which the subroutine exits to Step 1050 of FIG. 10.

Following the alternate path from Step 1105, the subroutine continues to Step 1140.

In Step 1140, the approximate exitance vector $\tilde{M}^{(r+p)}$ is calculated, where r refers to the previous value of the iteration calculator when p was zero, and where r+p is equal to the current value of the iteration counter. The approximate exitance vector $\tilde{M}^{(r+p)}$ is calculated using three or more of the saved exitance vectors $M^{(k)}$ (already saved, or saved from Step 1115), or $M_0$ and two or more of the saved exitance vectors $M^{(k)}$, and fitting the exitance for each element to a logarithmic curve, or to any other suitable curve that represents the behaviour of the exitance as a function of iteration. The curve may be an analytical curve, defined by a lookup table, or defined by an algorithm, for example.

In Step 1145, the Euclidean norm of the vector $|\tilde{M}^{(r+p)} - M^{(k)}|$ is calculated. Here, $M^{(k)}$ is the exitance vector for the current iteration k and not any of the values of $M^{(k)}$ previously saved in Step 1115.

In Step 1150, the Euclidean norm of the vector $|\tilde{M}^{(r+p)} - M^{(k)}|$ is compared to a predetermined limit. If it is greater than the limit, the subroutine exits to Step 1050 of FIG. 10; otherwise, the subroutine continues to Step 1155. In this case, the approximate exitance vector $\tilde{M}^{(r+p)}$ is sufficiently close to the current exitance vector $M^{(k)}$, and the previously saved feature vector represents the element properties for which skipping p iterations is likely acceptable.

In Step 1155, the previously saved feature vector and its associated element property from Step 1130 is presented to the neural network as a member of the network training set. One or more of the values k, r and p may also be provided to the neural network in association with the feature vector. The neural network builds a model that represents how feature vectors in general relate to the numbers of iterations that can be skipped. This allows other feature vectors, which are different to those used to train the neural network, to be later presented to the network, which can then determine if they are similar enough to the model. If there is enough similarity, then the network can predict that some iterations of the radiosity calculation can be skipped, according to what is in the model. The family of feature vectors used for training may be broad, covering many different geometries, element properties and stages of the radiosity calculation.

In Step 1160, the sequence counter is reset to zero, following which the subroutine exits to Step 1050 of FIG. 10.

The neural network may be trained using multiple environments, where it learns to recognize temporal sequences of the flow of light (expressed as the convergence behavior of the exitance vector) between surfaces in similar environments and generalize this behavior to larger classes of environment. For example, by learning to predict the flow of light within a variety of rooms with different dimensions, surface properties, and light sources, the neural network may learn to predict the flow of light within rooms with other properties.

Figure 12:
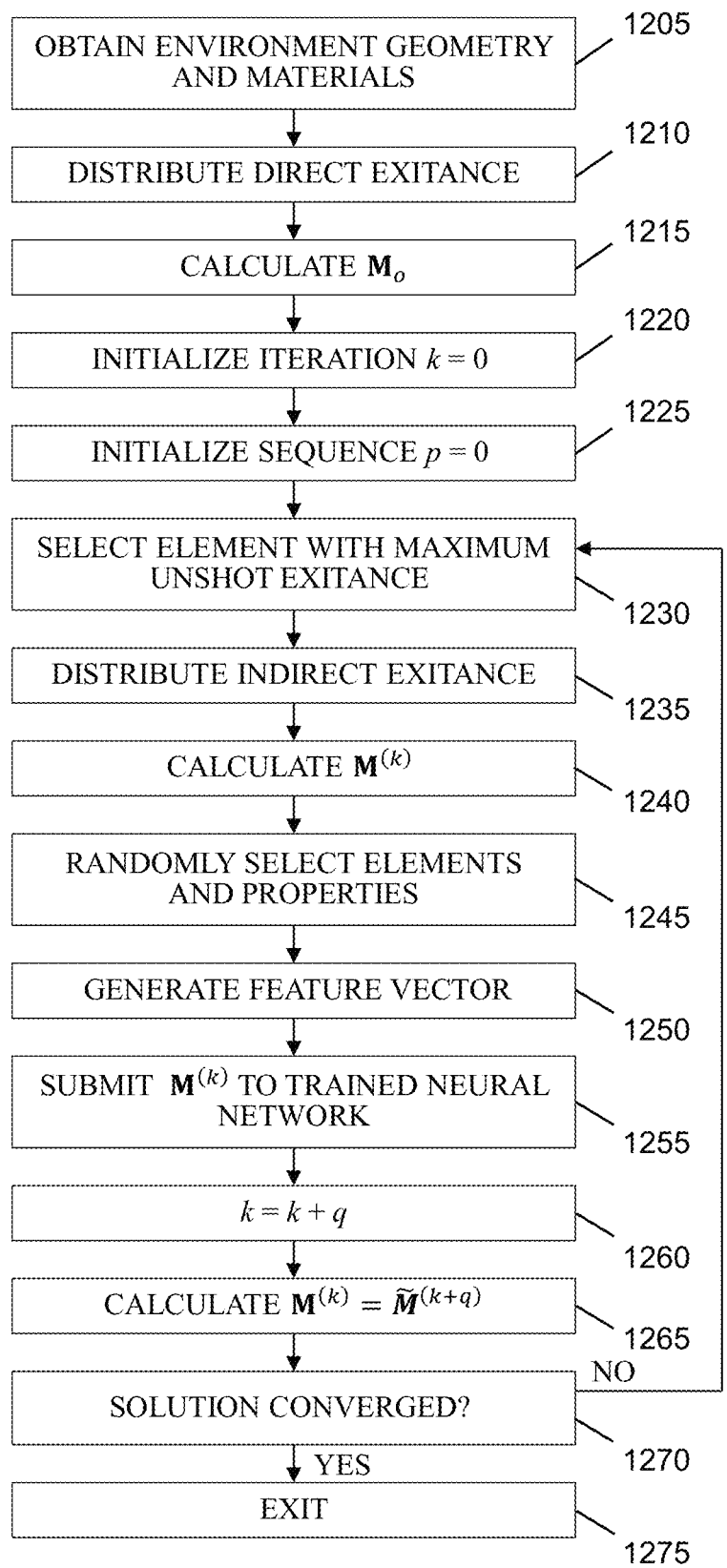
FIG. 12 shows a flow chart of a progressive radiosity method that incorporates a trained neural network.

FIG. 12 shows a flowchart regarding how a trained neural network can be used with the progressive radiosity method of FIG. 9. In Step 1205, the environment geometry and materials are made accessible to the program. In Step 1210, the exitance emitted by the luminaires in the environment is distributed to all of the elements visible to the luminaires. In Step 1215, the initial element exitances are expressed as the initial exitance vector $M_o$ in accordance with Equation 2.

In Step 1220, the iteration counter k is initialized to zero.
In Step 1225, the sequence counter p is initialized to zero.
In Step 1230, the element with the maximum "unshot" exitance is selected.

In Step 1235, the indirect unshot exitance is distributed to all of the elements visible to the currently selected element.

In Step 1240, the current element exitances are expressed as the current exitance vector $M^{(k)}$ in accordance with Equation 3.

In Step 1245, a random subset 's' of elements is selected from the set of elements visible from the current element shooting its exitance. An element property is also randomly selected from the common list of element properties.

In Step 1250, a feature vector comprised of the current exitance value and selected property value for each element of the element subset is generated.

In Step 1255, the feature vector and its associated element property is submitted to the trained neural network. The trained neural network effectively looks for a degree of similarity of the feature vector with other feature vectors represented by a model that it has created during training and possibly subsequent reinforcement. The model represents relationships between arbitrary feature vectors at various stages of convergence of the radiosity equation with numbers of iterations that can be skipped. The network identifies the closest match, or a close enough match of the feature vector to a portion of the model. The match may be, for example, within some predefined similarity measure that is user-configurable or learnt by the neural network. Once a match is identified, the neural network is able to predict how many iterations can be skipped by performing a curve-fitting calculation instead of the iterations, which is intended to reduce the overall convergence time of the radiosity calculation. The neural network subsequently emits a non-negative integer value q, representing the number of iterations that can be skipped.

In Step 1260, the iteration counter k is incremented by the value of q.

In Step 1265, the approximate exitance vector $\tilde{M}^{(k+q)}$ is calculated and assigned as the current exitance vector $M^{(k)}$, effectively skipping q iterations.

In Step 1270, the residual vector Q is calculated according to Equation 3. If the radiosity solution has converged, the method exits in Step 1275; otherwise, the method returns to Step 1230 for the next iteration.

As known to one skilled in the art, there are other machine learning models which may be employed to achieve the same ends. For example, decision trees may also be employed as a predictive model, depending on the constituent data and sample size used to as a means of prediction. The approach, however, is similar to neural networks in that the model allows the data to be used to train the machine to estimate or predict any given outcome. Also, it is possible to employ more than one machine learning model to refine the predicted result, and to determine the best heuristics for the problem to be solved. Equally important is the size of the computer used to make the necessary calculations, whether it is a central processing unit (CPU), graphics processing unit (GPU) or a combination of both. In addition, whether a system is an embedded unit may impact the model selected to predict an outcome. As a result, where the term neural network is used, it can refer to any machine learning model.

Selecting the subset of elements to be monitored may be determined by element area, distance to adjoining and nearby elements, approximate form factors based on tracing shadow rays to other elements, and spectral exitances of visible and partially visible elements. A static subset may be determined prior to radiosity calculations, and which is optionally dynamically updated as the radiosity calculations progress.

Light Probes

In another embodiment, a set of virtual light probes as described in, for example, Mandl, D., et al. 2017. "Learning Lightprobes for Mixed Reality Illumination," Proc. IEEE 2017 International Symposium on Mixed and Augmented Reality (ISMAR), pp. 82-89, and positioned within the environment to sample the light field distribution as the radiosity solution progresses. While these probes do not participate in the light transport between elements, they can nonetheless record the flow of exitance between sending and receiving elements with each iteration.

A particular advantage of light probes is that they can be automatically distributed in the volume of space between elements in the environment. Moreover, whereas an environment may have tens of thousands to millions of elements, it may only require tens to hundreds of light probes to adequately capture the light field distribution.

Another advantage of light probes in the present application is that after the first few iterations of the radiosity equation, the changes in light field distribution have very low spatial frequency. Consequently, the resolution of the light probes can be similarly low, possibly requiring no more than a virtual cubic illuminance meter (e.g., Cuttle, C. 1997. "Cubic Illumination," Lighting Research & Technology 29(1):1-14).

The training sets that may be used include raw data, or calculated data employed by the neural network, and which may be used in concert together (raw data and calculated data), or independently. The training sets may be held in an accessible flat file, in a database, or other means known to one skilled in the art, with data being uploaded to the training set from individual users to form a large data set, or locally to form a small training set. The more available data in a training set the more accurate the prediction by the neural network is likely to be. As such, the preferred embodiment is for a user to have access to a large training set from a database or flat file that is held online on a server or cloud environment. Additionally, the data entered by a user can be added to the data set in order to add to the size of the training set, and thus the accuracy of the model, subject to precautions with respect to user privacy.

Storage of the raw data and calculated data may be in the cloud, or a single server. The compilation of data from numerous sources will offset complications from potential restricted sets of geometries for the neural network to learn. As a result, a repository of thousands of designs and elements from remote clients will improve the accuracy of the neural networks.

Figure 13:
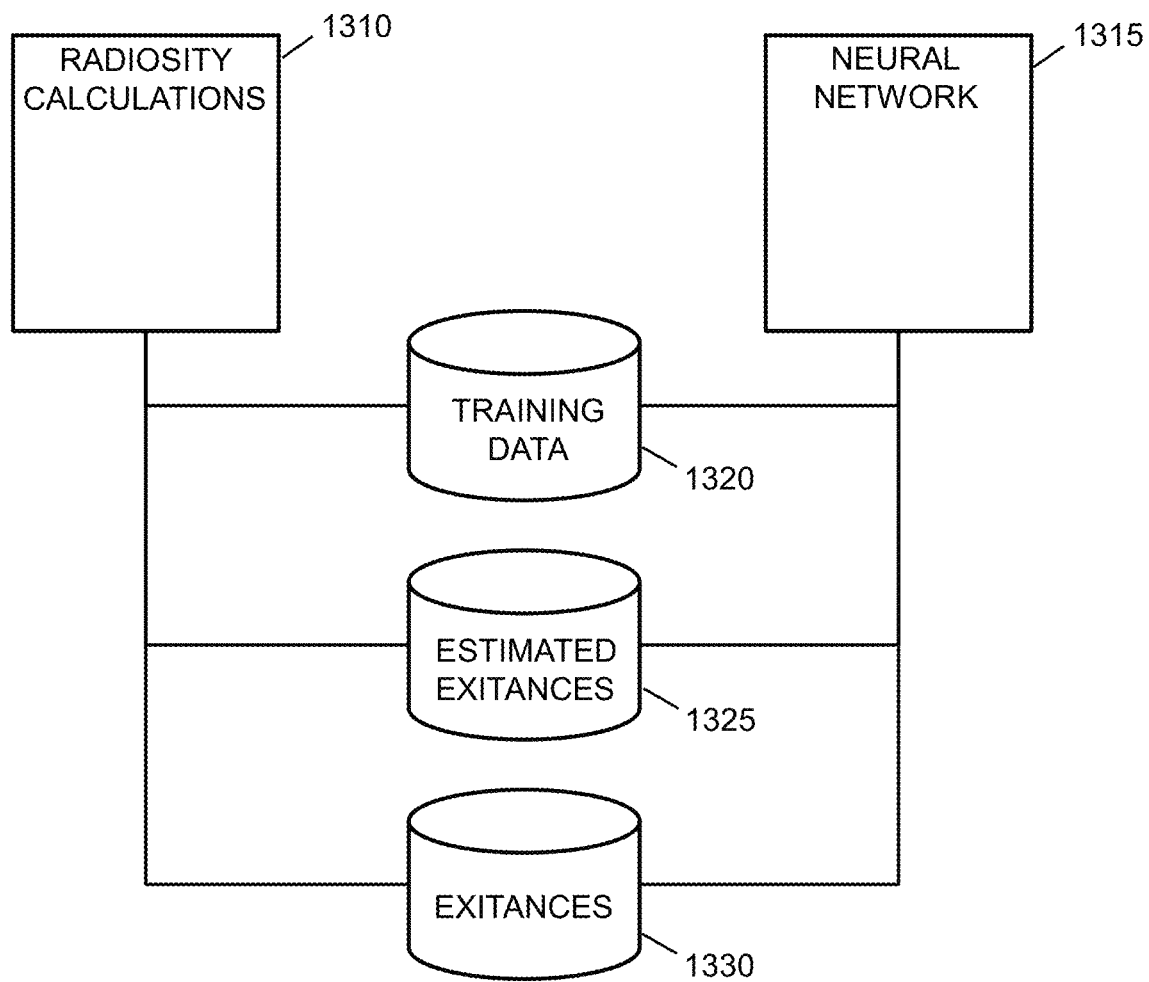
FIG. 13 shows an exemplary system for training and deploying the neural network.

Referring to FIG. 13, an exemplary system for training the radiosity neural network requires a computer 1310 to complete the radiosity calculations, a computer 1315 to support the neural networks and complete the training, a database 1320 to store the training data to be used in the neural networks, a database 1325 to store the estimated exitances for the finite element environments, and a database 1330 to store the actual values for the finite element environments connected to the computer used to complete the radiosity calculations. Functions of the system are provided by one or more sets of computer readable instructions stored in one or more computer-readable memories that are executed by one or more processors. The computer used to complete the radiosity calculations utilizing the CPU, GPU or both the CPU and GPU may be a different computer than that used to support the neural networks and the training of the neural network, or it may be the same unit. Additionally, the databases referenced above may be separate databases on a single computer, or multiple computers, and may be stored as multiple databases or as a single database. Additionally, the calculations, neural networks and databases may all be cloud based or other format known to one skilled in the art. The entire system may be networked as a single enterprise, or may utilize the elements separately.

Throughout the description, specific details have been set forth in order to provide a more thorough understanding of the invention. However, the invention may be practiced without these particulars. In other instances, well known elements have not been shown or described in detail and repetitions of steps and features have been omitted to avoid unnecessarily obscuring the invention. Accordingly, the specification is to be regarded in an illustrative, rather than a restrictive, sense.

The detailed description has been presented partly in terms of methods or processes, symbolic representations of operations, functionalities and features of the invention. These method descriptions and representations are the means used by those skilled in the art to most effectively convey the substance of their work to others skilled in the art. A software implemented method or process is here, and generally, understood to be a self-consistent sequence of steps leading to a desired result. These steps require physical manipulations of physical quantities. Often, but not necessarily, these quantities take the form of electrical or magnetic signals or values capable of being stored, transferred, combined, compared, and otherwise manipulated. It will be further appreciated that the line between hardware and software is not always sharp, it being understood by those skilled in the art that the software implemented processes described herein may be embodied in hardware, firmware, software, or any combination thereof. Such processes may be controlled by coded instructions such as microcode and/or by stored programming instructions in one or more tangible or non-transient media readable by a computer or processor. The code modules may be stored in any computer storage system or device, such as hard disk drives, optical drives, solid state memories, etc. The methods may alternatively be embodied partly or wholly in specialized computer hardware, such as ASIC or FPGA circuitry.

It will be clear to one having skill in the art that further variations to the specific details disclosed herein can be made, resulting in other embodiments that are within the scope of the invention disclosed. Two or more steps in the flowcharts may be performed in a different order, other steps may be added, or one or more may be removed without altering the main function of the invention. Electronic modules may be divided into constituent modules or combined into larger modules. All parameters, dimensions, materials, and configurations described herein are examples only and actual choices of such depend on the specific embodiment. Accordingly, the scope of the invention is to be construed in accordance with the substance defined by the following claims.

We claim:

1. A method for providing training data to a neural network that predicts when iterations can be skipped in a radiosity equation that is being solved, the method comprising the steps of:
    saving an exitance vector for an iteration r of multiple iterations of a radiosity calculation for an environment defined by multiple elements;
    selecting, at iteration r of the multiple iterations, a subset of the multiple elements that are visible to a sending element, wherein the sending element is selected from the multiple elements;
    selecting a property of the subset of the multiple elements;
    generating a feature vector comprising, for each element of the subset of the multiple elements, a value of the property and an exitance;
    calculating, after p iterations after iteration r of the radiosity calculation, an approximate exitance vector $\tilde{M}^{(r+p)}$ using the saved exitance vector, two other saved exitance vectors and a curve-fitting calculation;
    determining whether $|\tilde{M}^{(r+p)} - M^{(k)}|$ is below a limit, wherein $M^{(k)}$ is a current exitance vector at iteration k=r+p of the radiosity calculation;
    if $|\tilde{M}^{(r+p)} - M^{(k)}|$ is below the limit, presenting the feature vector to the neural network for training the neural network and if $|\tilde{M}^{(r+p)} - M^{(k)}|$ is not below the limit, not presenting the feature vector to the neural network, wherein the neural network is used to solve a radiosity equation for a building interior; and
    adjusting a placement of a luminaire, window or doorway in the building interior.

2. The method of claim 1 comprising presenting the number p to the neural network.

3. The method of claim 1 comprising, between the calculating and determining steps:
    establishing that $|\tilde{M}^{(r+p)} - M^{(k)}|$ is below the limit;
    performing one or more further iterations of the radiosity calculation; and
    calculating, with an increased value of p, another approximate exitance vector $\tilde{M}^{(r+p)}$ which is used in the determining step.

4. The method of claim 1 wherein the property of the subset of the multiple elements is:
    element area;
    distance between barycenters;
    form factor;
    angle between element normals;
    estimated exitance;
    spectral exitance; or
    convergence value.

5. The method of claim 1 wherein the property of the subset of the multiple elements is selected randomly.

6. The method of claim 1 wherein the elements of the subset of the multiple elements are selected randomly.

7. A method for skipping iterations when solving a radiosity equation, the method comprising the steps of:
    selecting, at an iteration k of a radiosity calculation for an interior building environment defined by multiple elements, a subset of the multiple elements that are visible to a sending element, wherein the sending element is selected from the multiple elements;
    selecting a property of the subset of the multiple elements;
    generating a feature vector comprising, for each element of the subset of the multiple elements, a value of the property and an exitance calculated at iteration k of the radiosity calculation;
    submitting the feature vector to a neural network that comprises a model relating feature vectors to numbers of iterations that can be skipped in radiosity calculations, wherein the neural network is used to solve a radiosity equation for the interior building environment;
    receiving, from the neural network, a number of iterations q that can be skipped;
    calculating an approximate exitance vector for iteration (k+q) of the radiosity calculation; and
    adjusting a placement of a luminaire, window or doorway in the interior building environment.

8. The method of claim 7, wherein the calculating step comprises curve-fitting to a current exitance vector and one or more prior exitance vectors and extrapolating to iteration (k+q) to obtain the approximate exitance vector.

9. The method of claim 7 wherein the property of the subset of the multiple elements is:
    element area;
    distance between barycenters;
    form factor;

angle between element normals;
estimated exitance;
spectral exitance; or
convergence value.

10. The method of claim 7 wherein the property of the subset of the multiple elements is selected randomly.

11. The method of claim 7 wherein the elements of the subset of the multiple elements are selected randomly.

12. A system for training a neural network that predicts when iterations can be skipped in a radiosity equation that is being solved for a building interior, the system comprising:
   a luminaire, window or doorway in the building interior;
   one or more processors; and
   one or more computer readable memories storing computer readable instructions, which, when executed by the one or more processors, cause the system to:
      save an exitance vector for an iteration r of multiple iterations of a radiosity calculation for an environment defined by multiple elements;
      select, at iteration r of the multiple iterations, a subset of the multiple elements that are visible to a sending element, wherein the sending element is selected from the multiple elements;
      select a property of the subset of the multiple elements;
      generate a feature vector comprising, for each element of the subset of the multiple elements, a value of the property and an exitance;
      calculate, after p iterations after iteration r of the radiosity calculation, an approximate exitance vector $\tilde{M}^{(r+p)}$ using the saved exitance vector, two other saved exitance vectors and a curve-fitting calculation;
      determine whether $|\tilde{M}^{(r+p)}-M^{(k)}|$ is below a limit, wherein $M^{(k)}$ is a current exitance vector at iteration k=r+p of the radiosity calculation;
      if $|\tilde{M}^{(r+p)}-M^{(k)}|$ is below the limit, presenting the feature vector to the neural network for training the neural network and if $|\tilde{M}^{(r+p)}-M^{(k)}|$ is not below the limit, not presenting the feature vector to the neural network, wherein the neural network is used to solve a radiosity equation for a building interior; and
      adjust a placement of the luminaire, window or doorway in the building interior.

13. The system of claim 12, wherein the one or more processors and the one or more computer readable memories are distributed amongst:
   a first computer configured to perform the radiosity calculation;
   a second computer configured to support the neural network;
   a first database connected to the first and second computers and configured to store the feature vector;
   a second database connected to the first and second computers and configured to store the approximate exitance vector $\tilde{M}^{(r+p)}$; and
   a third database connected to the first and second computers and configured to store all the saved exitance vectors.

14. The system of claim 12 further configured to:
   establish, after calculating the approximate exitance vector, that $|\tilde{M}^{(r+p)}-M^{(k)}|$ is below the limit;
   perform one or more further iterations of the radiosity calculation; and
   calculate, with an increased value of p, another approximate exitance vector $\tilde{M}^{(r+p)}$ which is used to determine that $|\tilde{M}^{(r+p)}-M^{(k)}|$ is below the limit.

15. A system for skipping iterations when solving a radiosity equation comprising:
   a luminaire, window or doorway in an interior building environment that is defined by multiple elements;
   one or more processors; and
   one or more computer readable memories storing computer readable instructions, which, when executed by the one or more processors, cause the system to:
      select, at an iteration k of a radiosity calculation for the interior building environment, a subset of the multiple elements that are visible to a sending element, wherein the sending element is selected from the multiple elements;
      select a property of the subset of the multiple elements;
      generate a feature vector comprising, for each element of the subset of the multiple elements, a value of the property and an exitance calculated at iteration k of the radiosity calculation;
      submit the feature vector to a neural network that comprises a model relating feature vectors to numbers of iterations that can be skipped in radiosity calculations, wherein the neural network is used to solve a radiosity equation for the interior building environment;
      receive, from the neural network, a number of iterations q that can be skipped;
      calculate an approximate exitance vector for iteration (k+q) of the radiosity calculation; and
      adjust a placement of the luminaire, window or doorway in the interior building environment.

16. The system of claim 15, configured to perform curve-fitting to a current exitance vector and one or more prior exitance vectors, and extrapolate to iteration (k+q) to obtain the approximate exitance vector.

* * * * *